(12) United States Patent
Su et al.

(10) Patent No.: US 10,128,273 B2
(45) Date of Patent: Nov. 13, 2018

(54) ACTIVE DEVICE ARRAY SUBSTRATE

(71) Applicant: Au Optronics Corporation, Hsinchu (TW)

(72) Inventors: Chih-Chung Su, Kaohsiung (TW); Po-Hsueh Chen, Taoyuan (TW); Yi-Wei Chen, Hsinchu (TW); Hsiu-Chun Hsieh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 35 days.

(21) Appl. No.: 15/099,613

(22) Filed: Apr. 15, 2016

(65) Prior Publication Data

US 2017/0062477 A1     Mar. 2, 2017

(30) Foreign Application Priority Data

Sep. 1, 2015  (TW) .............................. 104128784 A

(51) Int. Cl.
*H01L 27/12* (2006.01)
*H01L 29/786* (2006.01)

(52) U.S. Cl.
CPC ........ *H01L 27/124* (2013.01); *H01L 27/1222* (2013.01); *H01L 29/78633* (2013.01)

(58) Field of Classification Search
CPC ............. H01L 27/124; H01L 29/78633; H01L 27/1222; H01L 23/642
See application file for complete search history.

(56) References Cited

U.S. PATENT DOCUMENTS

| | | | |
|---|---|---|---|
| 6,297,862 B1 * | 10/2001 | Murade ............. | G02F 1/136209 349/110 |
| 6,327,006 B1 | 12/2001 | Sato et al. | |
| 7,554,630 B2 | 6/2009 | Kwon et al. | |
| 2007/0069205 A1 * | 3/2007 | Jinno ...................... | H01L 27/12 257/40 |
| 2010/0060812 A1 | 3/2010 | Song et al. | |
| 2010/0225609 A1 * | 9/2010 | Huang ................ | G02F 1/13338 345/173 |
| 2013/0027286 A1 * | 1/2013 | Zhou .................... | G09G 3/3648 345/92 |
| 2013/0248870 A1 | 9/2013 | Jung et al. | |
| 2016/0148951 A1 * | 5/2016 | Yang ..................... | H01L 27/124 257/72 |

* cited by examiner

*Primary Examiner* — Steven Loke
*Assistant Examiner* — Juanita Rhodes
(74) *Attorney, Agent, or Firm* — JCIPRNET

(57) ABSTRACT

An active device array substrate including a first scan line, a first data line, a second data line, a first active device, a first pixel electrode, a second active device, a second pixel electrode, and a first shielding pattern layer is provided. The first active device includes a first gate electrically connected to the first scan line, a first semiconductor pattern layer, a first source electrically connected to the first data line, and a first drain. The second active device includes a second gate electrically connected to the first scan line, a second semiconductor pattern layer, a second source electrically connected to the second data line, and a second drain. The first shielding pattern layer is overlapped with the first semiconductor pattern layer and the second semiconductor pattern layer. The first shielding pattern layer is overlapped with the second data line and not overlapped with the first data line.

11 Claims, 14 Drawing Sheets

ACTIVE DEVICE ARRAY SUBSTRATE

CROSS-REFERENCE TO RELATED APPLICATION

This application claims the priority benefit of Taiwan application serial no. 104128784, filed on Sep. 1, 2015. The entirety of the above-mentioned patent application is hereby incorporated by reference herein and made a part of this specification.

BACKGROUND OF THE INVENTION

Field of the Invention

The invention relates to a substrate, and more particularly, to an active device array substrate.

Description of Related Art

As display techniques become more advanced, life is made more convenient with assistance from displays, and in order to achieve the features of light and thin, flat panel displays (FPDs) have become the current mainstream. In general, the pixel structure of a display panel at least includes an active device and a pixel electrode electrically connected to the active device. The active device is used as a switching device of a display unit. The active device includes a gate electrically connected to a scan line, a semiconductor pattern layer overlapped with the gate, a source electrically connected to a data line and one end of the semiconductor pattern layer, and a drain electrically connected to another end of the semiconductor pattern layer. To reduce electric leakage of the active device, in general, the pixel structure further includes a shielding pattern layer disposed under the semiconductor layer.

SUMMARY OF THE INVENTION

The invention provides a plurality of active device array substrates capable of alleviating the crosstalk phenomenon.

An active device array substrate of the embodiment includes a first scan line, a first data line, a second data line, a first active device, a first pixel electrode, a second active device, a second pixel electrode, and a first shielding pattern layer. The first active device includes a first gate electrically connected to the first scan line, a first semiconductor pattern layer overlapped with the first gate, a first source electrically connected to the first semiconductor pattern layer and electrically connected to the first data line, and a first drain electrically connected to the first semiconductor pattern layer. The first pixel electrode is electrically connected to the first drain of the first active device. The second active device includes a second gate electrically connected to the first scan line, a second semiconductor pattern layer overlapped with the second gate, a second source electrically connected to the second semiconductor pattern layer and electrically connected to the second data line, and a second drain electrically connected to the second semiconductor pattern layer. The second pixel electrode is electrically connected to the second drain of the second active device. The first shielding pattern layer is overlapped with the first semiconductor pattern layer and the second semiconductor pattern layer. The first shielding pattern layer is overlapped with the second data line and not overlapped with the first data line.

Another active device array substrate of the embodiment includes a first scan line, a first data line, a second data line, a first active device, a first pixel electrode, a second active device, a second pixel electrode, and a shielding pattern layer. The first active device includes a first gate electrically connected to the first scan line, a first semiconductor pattern layer overlapped with the first gate, a first source electrically connected to the first semiconductor pattern layer and electrically connected to the first data line, and a first drain electrically connected to the first semiconductor pattern layer. The first pixel electrode is electrically connected to the first drain of the first active device. The second active device includes a second gate electrically connected to the first scan line, a second semiconductor pattern layer overlapped with the second gate, a second source electrically connected to the second semiconductor pattern layer and electrically connected to the second data line, and a second drain electrically connected to the second semiconductor pattern layer. The second pixel electrode is electrically connected to the second drain of the second active device. The shielding pattern layer is overlapped with the first semiconductor pattern layer. The second semiconductor pattern layer is not overlapped with any shielding pattern layer.

Another active device array substrate of the embodiment includes a plurality of first repeating units and a plurality of second repeating units arranged with the first repeating units. Each of the first repeating units includes a first scan line, a first data line, a second data line, a first active device, a first pixel electrode, a second active device, a second pixel electrode, and a first shielding pattern layer. The first active device includes a first gate electrically connected to the first scan line, a first semiconductor pattern layer overlapped with the first gate, a first source electrically connected to the first semiconductor pattern layer and electrically connected to the first data line, and a first drain electrically connected to the first semiconductor pattern layer. The first pixel electrode is electrically connected to the first drain of the first active device. The second active device includes a second gate electrically connected to the first scan line, a second semiconductor pattern layer overlapped with the second gate, a second source electrically connected to the second semiconductor pattern layer and electrically connected to the second data line, and a second drain electrically connected to the second semiconductor pattern layer. The second pixel electrode is electrically connected to the second drain of the second active device. The first shielding pattern layer is overlapped with the first semiconductor pattern layer and the second semiconductor pattern layer. The first shielding pattern layer is overlapped with the second data line and not overlapped with the first data line. Each of the second repeating units includes at least one scan line, at least one data line, at least one active device electrically connected to the scan line and the data line, at least one pixel electrode electrically connected to the at least one active device, and at least one shielding pattern layer disposed corresponding to the active device.

Yet another active device array substrate of the embodiment includes a plurality of first repeating units and a plurality of second repeating units arranged with the first repeating units. Each of the first repeating units includes a first scan line, a first data line, a second data line, a first active device, a first pixel electrode, a second active device, a second pixel electrode, and a shielding pattern layer. The first active device includes a first gate electrically connected to the first scan line, a first semiconductor pattern layer overlapped with the first gate, a first source electrically connected to the first semiconductor pattern layer and electrically connected to the first data line, and a first drain electrically connected to the first semiconductor pattern layer. The first pixel electrode is electrically connected to the first drain of the first active device. The second active device includes a second gate electrically connected to the first scan line, a second semiconductor pattern layer overlapped with the second gate, a second source electrically connected to the second semiconductor pattern layer and electrically connected to the second data line, and a second drain electrically connected to the second semiconductor pattern layer. The second pixel electrode is electrically connected to the second drain of the second active device. The shielding pattern layer is overlapped with the first semiconductor pattern layer. The second semiconductor pattern layer is not overlapped with any shielding pattern layer. Each of the second repeating units includes at least one scan line, at least one data line, at least one active device electrically connected to the scan line and the data line, at least one pixel electrode electrically connected to the at least one active device, and at least one shielding pattern layer disposed corresponding to the active device.

Based on the above, in the active device array substrate of an embodiment of the invention, the first shielding pattern layer is overlapped with adjacent first semiconductor pattern layer and second semiconductor pattern layer. Accordingly, the capacitance between the second semiconductor pattern layer and the second shielding pattern layer can compensate the capacitance between the first semiconductor pattern layer and the first shielding pattern layer and influence to the first pixel electrode level, and as a result the issue of crosstalk is alleviated.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The disposition of a shielding pattern layer causes the coupling capacitance to be too high, thus causing issues such as crosstalk and excess loading, and is not good for the aperture ratio of a display panel.

Figure 1:
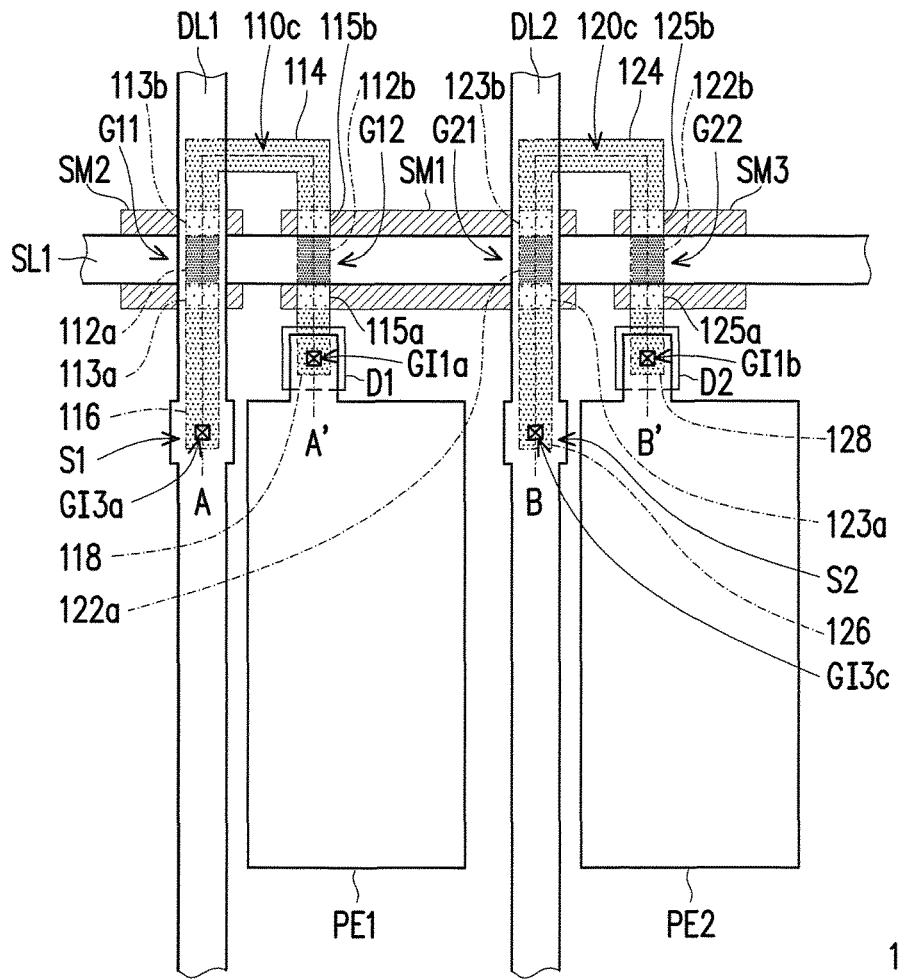
FIG. 1 is a top view of a first repeating unit of an embodiment of the invention.
Figure 2:
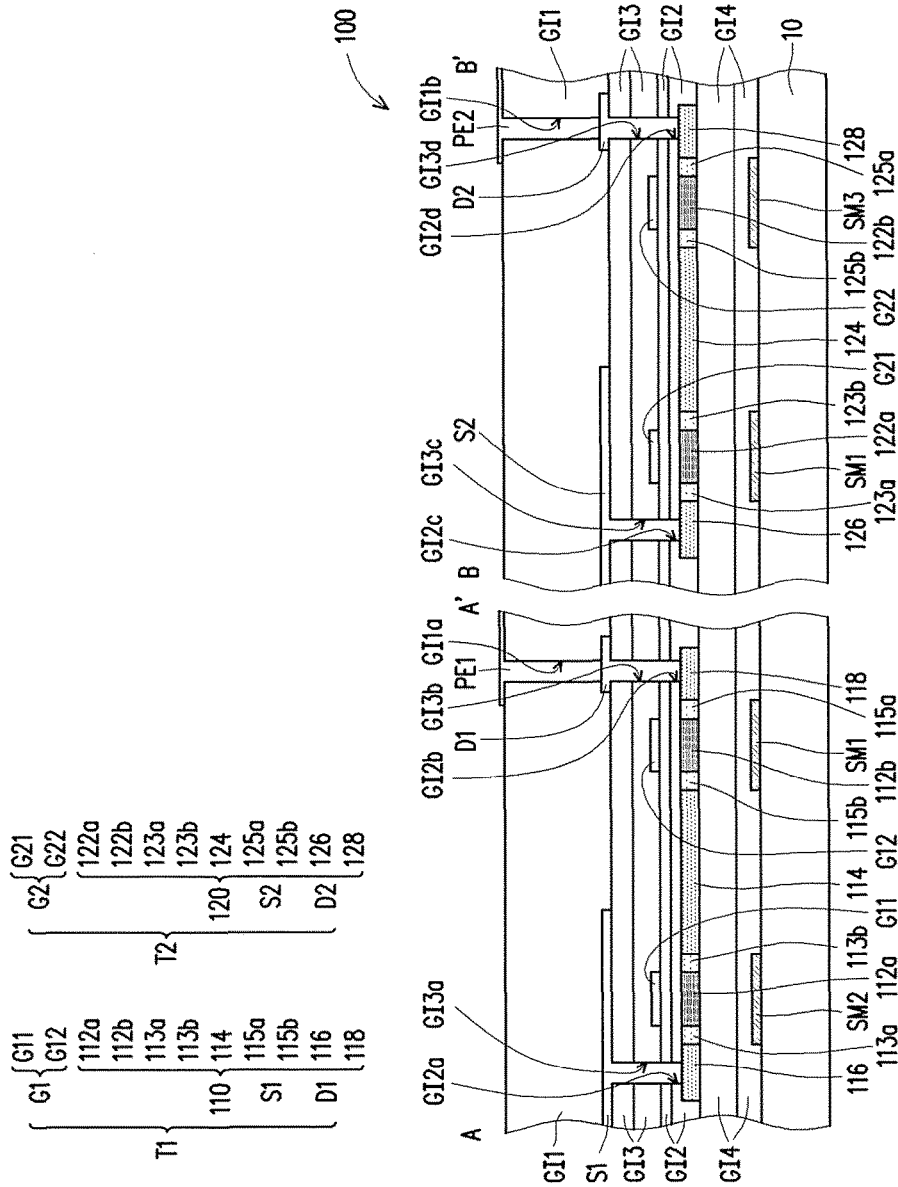
FIG. 2 is a cross-sectional schematic of the first repeating unit shown according to lines A-A' and B-B' of FIG. 1.

FIG. 1 is a top view of a first repeating unit of an embodiment of the invention. FIG. 2 is a cross-sectional schematic of the first repeating unit shown according to lines A-A' and B-B' of FIG. 1. Referring to FIG. 1 and FIG. 2, a first repeating unit 100 is disposed on a substrate 10. The substrate 10 may be a light-transmissive substrate or an opaque/reflective substrate. The material of the light-transmissive substrate can be glass, quartz, organic polymer, or other suitable materials. The material of the opaque/reflective substrate may be a conductive material, a wafer, ceramic, or other suitable materials.

Each of the first repeating units 100 includes a first scan line SL1 (labeled in FIG. 1), a first data line DL1 (labeled in FIG. 1), a second data line DL2 (labeled in FIG. 1), a first active device T1, a first pixel electrode PE1, a second active device T2, a second pixel electrode PE2, and a first shielding pattern layer SM1. As shown in FIG. 1, the first scan line SL1 interlaces the first and second data lines DL1 and DL2. For instance, in the present embodiment, the first and second data lines DL1 and DL2 may be parallel to each other, and the first scan line SL1 and the first data line DL1 may be perpendicular to each other, but the embodiment is not limited thereto. In other embodiments, the first scan line SL1 and the first and second data lines DL1 and DL2 can also be disposed in other ways. The first and second data lines DL1 and DL2 may be exemplified as adjacently disposed in order. In other words, no data line connected to other active devices is disposed between the first and second data lines DL1 and DL2 as an example. Out of consideration for conductivity, material of the first scan line SL1 and the first and second data lines DL1 and DL2 may be metal, but the embodiment is not limited thereto. In other embodiments, the first scan line SL1 and the first and second data lines DL1 and DL2 may also adopt other conductive materials, such as: an alloy, nitride of a metal material, oxide of a metal material, oxynitride of a metal material, or stacked layers of a metal material and other conductive materials.

The first active device T1 includes a first gate G1 electrically connected to the first scan line SL1 (labeled in FIG. 1), a first semiconductor pattern layer 110 overlapped with the first gate G1, a first source S1 electrically connected to the first semiconductor pattern layer 110 and the first data line DL1, and a first drain D1 electrically connected to the first semiconductor pattern layer 110. The first pixel electrode PE1 is electrically connected to the first drain D1 of the first active device T1. Specifically, the active device array substrate of the present embodiment further includes an insulation layer GI1 (shown in FIG. 2). The insulation layer GI1 covers the first drain D1 and has an opening GI1a exposing the first drain D1. The first pixel electrode PE1 may be disposed on the insulation layer GI1 and filled in the opening GI1a of the insulation layer GI1 to be in electrical contact with the first drain D1. The insulation layer GI1 may be a single film layer or formed by stacking a plurality of film layers. The material of the insulation layer GI1 may be inorganic material (such as silicon oxide, silicon nitride, or silicon oxynitride), organic material, or combination thereof. The first pixel electrode PE1 may be a transmissive pixel electrode, a reflective pixel electrode, or a semi-transmissive, semi-reflective pixel electrode. The material of the transmissive pixel electrode includes metal oxide such as indium tin oxide, indium zinc oxide, aluminum tin oxide, aluminum zinc oxide, indium germanium zinc oxide, other suitable materials, or stacked layers of at least two of the above. The material of the reflective pixel electrode may be a metal material having high reflectivity or other suitable materials. A combination of a transmissive pixel electrode and a reflective pixel electrode may be used for the semi-transmissive electrode or the semi-reflective electrode.

In the present embodiment, the first active device T1 can optionally be a dual-gate thin-film transistor or other multi-gate thin-film transistor. Specifically, the first gate G1 of the first active device T1 includes two gate portions G11 and G12. The two gate portions G11 and G12 can be two different portions corresponding to the first scan line SL1. The first semiconductor pattern layer 110 includes two channel portions 112a and 112b respectively overlapped with the connecting portion 114, the source portion 116 and the drain portion 118, and the two gate portions G11 and G12. The channel portion 112a is disposed between the source portion 116 and the connecting portion 114. The connecting portion 114 is disposed between the two channel portions 112a and 112b. The connecting portion 114 can be a heavily-doped portion to reduce resistance between the two channel portions 112a and 112b. The channel portion 112b is disposed between the connecting portion 114 and the drain portion 118. The first semiconductor pattern layer 110 further includes lightly-doped portions 113a and 113b and lightly-doped portions 115a and 115b. The lightly-doped portions 113a and 113b are located between the source portion 116 and the connecting portion 114, and the lightly-doped portions 113a and 113b are respectively located at two different sides of the channel portion 112a. The lightly-doped portions 115a and 115b are located between the drain portion 118 and the connecting portion 114, and the lightly-doped portions 115a and 115b are respectively located at two different sides of the channel portion 112b. The lightly-doped portions 113a, 113b, 115a, and 115b can inhibit leakage current of the first active device T1.

Referring to FIG. 1 and FIG. 2, the source portion 116 of the first semiconductor pattern layer 110 is electrically connected to the first source S1. As shown in FIG. 1, the first source S1 can be a portion of the first data line DL1. As shown in FIG. 2, the active device array substrate further includes an insulation layer GI2. The insulation layer GI2 covers the first channel pattern layer 110, and the first gate G1 is disposed on the insulation layer GI2. The insulation layer GI2 has an opening GI2a exposing the source portion 116 of the first channel pattern layer 110. The active device array substrate further includes an insulation layer GI3. The insulation layer GI3 covers the first gate G1 and has an opening GI3a connected to the opening GI2a. The first source S1 is disposed on the insulation layer GI3 and filled in the openings GI2a and GI3a to be in electrical contact with the source portion 116 of the first semiconductor pattern layer 110. Referring to FIG. 1 and FIG. 2, the drain portion 118 of the first semiconductor pattern layer 110 is in electrical contact with the first drain D1. As shown in FIG. 1, the first drain D1 is separated from the first and second data lines DL1 and DL2 and can optionally belong to the same patterned film layer. As shown in FIG. 2, the insulation layers GI2 and GI3 further respectively have openings GI2b and GI3b connected to each other. The openings GI2b and GI3b expose the drain portion 118 of the first semiconductor pattern layer 110, and the first drain D1 is filled in the openings GI2b and GI3b to be in electrical contact with the drain portion 118 of the first semiconductor pattern layer 110. At least one of the insulation layers GI2 and GI3 may be a single film layer or formed by stacking a plurality of film layers. The material of the insulation layers GI2 and GI3 may be inorganic material (such as: silicon oxide, silicon nitride, or silicon oxynitride), organic material, or combination thereof. In the present embodiment, the insulation layers GI2 and GI3 can be exemplified as formed by stacking double film layers, but are not limited thereto.

Similarly, the second active device T2 includes a second gate G2 electrically connected to the first scan line SL1 (labeled in FIG. 1), a second semiconductor pattern layer 120 overlapped with the second gate G2, a second source S2 electrically connected to the second semiconductor pattern layer 120 and the second data line DL2 (labeled in FIG. 1), and a second drain D2 electrically connected to the second semiconductor pattern layer 120. The second pixel electrode PE2 is electrically connected to the second drain D2 of the second active device T2. Specifically, as shown in FIG. 2, the insulation layer GI1 covers the second drain D2 and has an opening GI1b exposing the second drain D2. The second pixel electrode PE2 is disposed on the insulation layer GI1 and filled in the opening GI1b of the insulation layer GI1 to be in electrical contact with the second drain D2. The second pixel electrode PE2 may be a transmissive pixel electrode, a reflective pixel electrode, or a semi-transmissive, semi-reflective pixel electrode. The material of the transmissive pixel electrode includes a metal oxide such as indium tin oxide, indium zinc oxide, aluminum tin oxide, aluminum zinc oxide, indium germanium zinc oxide, other suitable materials, or stacked layers of at least two of the above. The material of the reflective pixel electrode can be a metal material having high reflectivity or other suitable materials. The material of the semi-transmissive, semi-reflective pixel electrode can be a combination of a material of a transmissive pixel electrode and a material of a reflective pixel electrode.

In the present embodiment, the second active device T2 can optionally be a dual-gate thin-film transistor or other multi-gate thin-film transistor. The second gate G2 of the second active device T2 includes two gate portions G21 and G22. The two gate portions G21 and G22 can be two different portions of the first scan line SL1. The second semiconductor pattern layer 120 includes a connecting portion 124, a source portion 126 and a drain portion 128, and two channel portions 122a and 122b respectively overlapped with the two gate portions G21 and G22. The channel portion 122a is disposed between the source portion 126 and the connecting portion 124. The connecting portion 124 is disposed between the two channel portions 122a and 122b. The connecting portion 124 may be a heavily-doped portion to reduce resistance between the two channel portions 122a and 122b. The channel portion 122b is disposed between the connecting portion 124 and the drain portion 128. The second semiconductor pattern layer 120 further includes lightly-doped portions 123a and 123b and lightly-doped portions 125a and 125b. The lightly-doped portions 123a and 123b are located between the source portion 126 and the connecting portion 124, and the lightly-doped portions 123a and 123b are respectively located at two different sides of the channel portion 122a. The lightly-doped portions 125a and 125b are located between the drain portion 128 and the connecting portion 124, and the lightly-doped portions 125a and 125b are respectively located at two different sides of the channel portion 122b. The lightly-doped portions 123a, 123b, 125a, and 125b can inhibit leakage current of the second active device T2.

Referring to FIG. 1 and FIG. 2, the source portion 126 of the second semiconductor pattern layer 120 is electrically connected to the second source S2. As shown in FIG. 1, the second source S2 can be a portion of the second data line DL2. As shown in FIG. 2, the insulation layer GI2 covers the second channel pattern layer 120 and the second gate G2 is disposed on the insulation layer GI2. The insulation layer GI2 has an opening GI2c exposing the source portion 126 of the second channel pattern layer 120. The insulation layer GI3 covers the second gate G2 and has an opening GI3c connected to or/and overlapped with the opening GI2c. The second source S2 is disposed on the insulation layer GI3 and filled in the openings GI2c and GI3c to be in electrical contact with the source portion 126 of the second semiconductor pattern layer 120. Referring to FIG. 1 and FIG. 2, the drain portion 128 of the second semiconductor pattern layer 120 is in electrical contact with the second drain D2. As shown in FIG. 1, the second drain D2 is separated from the first and second data lines DL1 and DL2 and can optionally belong to the same film layer. As shown in FIG. 2, the insulation layers GI2 and GI3 further respectively have openings GI2d and GI3d connected to each other. The openings GI2d and GI3d expose the drain portion 128 of the second semiconductor pattern layer 120. The second drain D2 is filled in the openings GI2d and GI3d to be in electrical contact with the drain portion 128 of the second semiconductor pattern layer 120.

As shown in FIG. 1, in the present embodiment, the first and second semiconductor pattern layers 110 and 120 can optionally both be U-shaped semiconductor pattern layers. More specifically, the first and second semiconductor pattern layers 110 and 120 can be two U-shaped semiconductor pattern layers for which the openings respectively face the first and second pixel electrodes PE1 and PE2. The two ends of the first semiconductor pattern layer 110 are located at the same side of the first scan line SL1, and a center portion 110c of the first semiconductor pattern layer 110 is located at another side of the first scan line SL1. The two ends of the second semiconductor pattern layer 120 are located at the same side of the first scan line SL1, and the center portion 120c of the second semiconductor pattern layer 120 is located at another side of the first scan line SL1. It should be mentioned that, the shapes of the first and second semiconductor pattern layers 110 and 120 are only exemplary to the present embodiment and are not intended to limit the invention. In other embodiments, the first and second semiconductor pattern layers 110 and 120 can also have other suitable shapes; moreover, the shapes of the first and second semiconductor pattern layers 110 and 120 can also be different.

Referring to FIG. 1, the first shielding pattern layer SM1 is overlapped with the first semiconductor pattern layer 110 and the second semiconductor pattern layer 120. The first shielding pattern layer SM1 is overlapped with the second data line DL2 and not overlapped with the first data line DL1. In other words, the first semiconductor pattern layer 110 includes a first portion (such as the channel portion 112b and the lightly-doped portions 115a and 115b) not overlapped with the first data line DL1, the second semiconductor pattern layer 120 includes a second portion (such as the channel portion 122a and the lightly-doped portions 123a and 123b) overlapped with the second data line DL2, and the first shielding pattern layer SM1 may be continuously extended from under the first portion to under the second portion. Referring to FIG. 1 and FIG. 2, in the present embodiment, the first repeating unit 100 may further include a second shielding pattern layer SM2 and a third shielding pattern layer SM3. The second shielding pattern layer SM2 is separated from the first shielding pattern layer SM1. The second shielding pattern layer SM2 is overlapped with the first data line D1 and not overlapped with the second data line DL2. The second shielding pattern layer SM2 shields the channel portion 112a and the lightly-doped portions 113a and 113b of the first semiconductor pattern layer 110. The third shielding pattern layer SM3 is separated from the first shielding pattern layer SM1 and the second shielding pattern layer SM. The third shielding pattern layer SM3 is overlapped with the second semiconductor pattern layer 120 and is not overlapped with the first data line DL1 and the second data line DL2. The third shielding pattern layer SM3 shields the channel portion 122b and the lightly-doped portions 125a and 125b of the second semiconductor pattern layer 120.

Referring to FIG. 2, in the present embodiment, the first shielding pattern layer SM1, the second shielding pattern layer SM2, and the third shielding pattern layer SM3 may belong to the same patterned film layer. The active device array substrate 100 further includes an insulation layer GI4. The insulation layer GI4 covers the first shielding pattern layer SM1, the second shielding pattern layer SM2, and the third shielding pattern layer SM3, and the first semiconductor pattern layer 110 and the second semiconductor pattern layer 120 are disposed on the insulation layer GI4. The insulation layer GI4 can be a single film layer or formed by stacking a plurality of film layers. The material of the insulation layer GI4 may be an inorganic material (such as silicon oxide, silicon nitride, or silicon oxynitride), an organic material, or a combination thereof. In the present embodiment, the insulation layer GI4 is exemplified as formed by stacking double film layers, but is not limited thereto. The material of the first shielding pattern layer SM1, the second shielding pattern layer SM2, and the third shielding pattern layer SM3 may be metal or other opaque materials.

Figure 3:
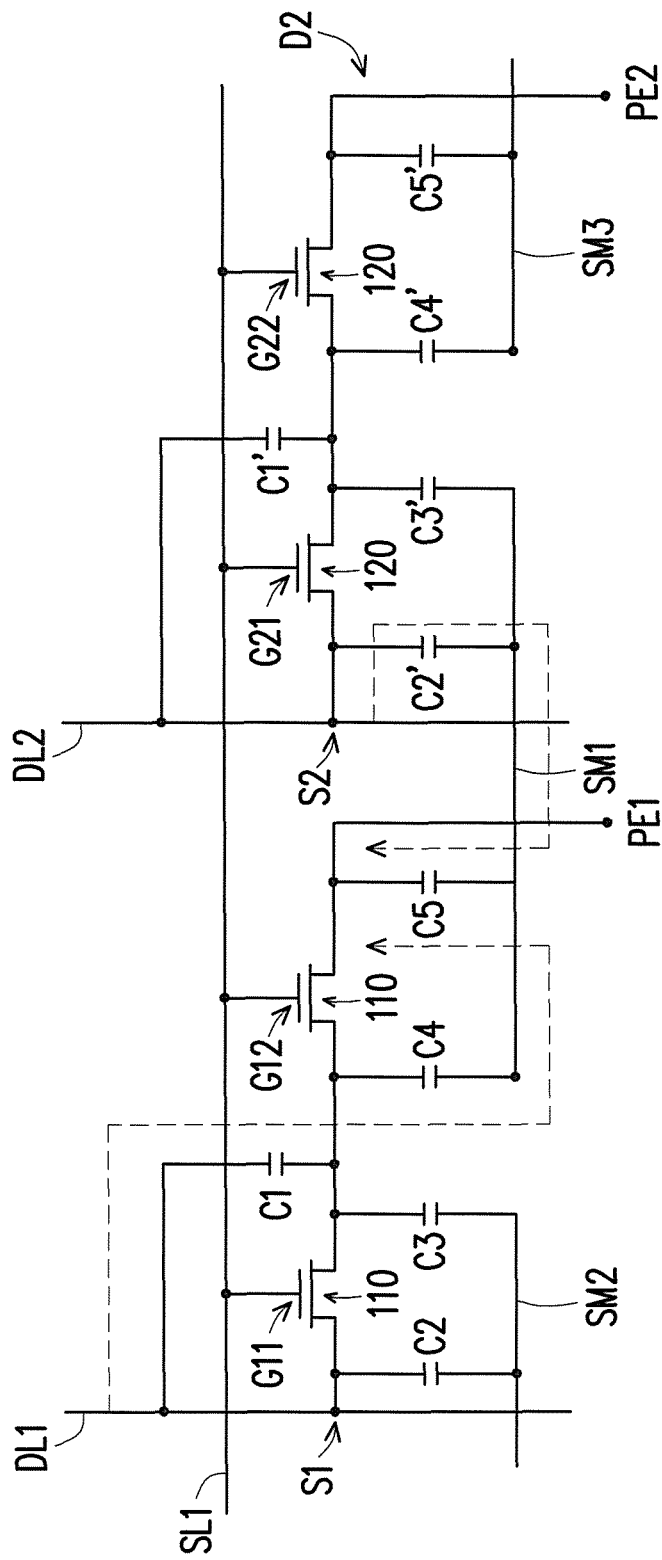
FIG. 3 is a schematic of an equivalent circuit of the first repeating unit 100 of FIG. 1.

FIG. 3 is a schematic of an equivalent circuit of the first repeating unit 100 of FIG. 1. Referring to FIG. 1 and FIG. 3, there is a capacitance C1 between the first data line DL1 and the lightly-doped portion 113b and a portion of the connecting portion 114 of the first semiconductor pattern layer 110. There is a capacitance C2 between the lightly-doped portion 113a and the second shielding pattern layer SM2 of the first semiconductor pattern layer 110. There is a capacitance C3 between the lightly-doped portion 113b and the second shielding pattern layer SM2 of the first semiconductor pattern layer 110. There is a capacitance C4 between the lightly-doped portion 115b and the first shielding pattern layer SM1 of the first semiconductor pattern layer 110. There is a capacitance C5 between the lightly-doped portion 115a and the first shielding pattern layer SM1 of the first semiconductor pattern layer 110. There is a capacitance C1' between the second data line DL2, the lightly-doped portion 123b and a portion of the connecting portion 124 of the second semiconductor pattern layer 120. There is a capacitance C2' between the lightly-doped portion 123a and the first shielding pattern layer SM1 of the second semiconductor pattern layer 120. There is a capacitance C3' between the lightly-doped portion 123b and the first shielding pattern layer SM1 of the second semiconductor pattern layer 120. There is a capacitance C4' between the lightly-doped portion 125b and the third shielding pattern layer SM3 of the second semiconductor pattern layer 120. There is a capacitance C5' between the lightly-doped portion 125a and the third shielding pattern layer SM3 of the second semiconductor pattern layer 120. In the present embodiment, when the polarity of the first data line DL1 is different from the polarity of the second data line DL2 (i.e., when the signal inputted to the first data line DL1 has a positive polarity and the signal inputted to the second data line DL2 has a negative polarity, or the signal inputted to the first data line DL1 has a negative polarity and the signal inputted to the second data line DL2 has a positive polarity), the capacitances C2' and C3' compensate the original influence to the level of the first pixel electrode PE from the capacitances C4 and C5. As a result, the issue of crosstalk of a display panel adopting the first repeating units 100 is alleviated.

Figure 4:
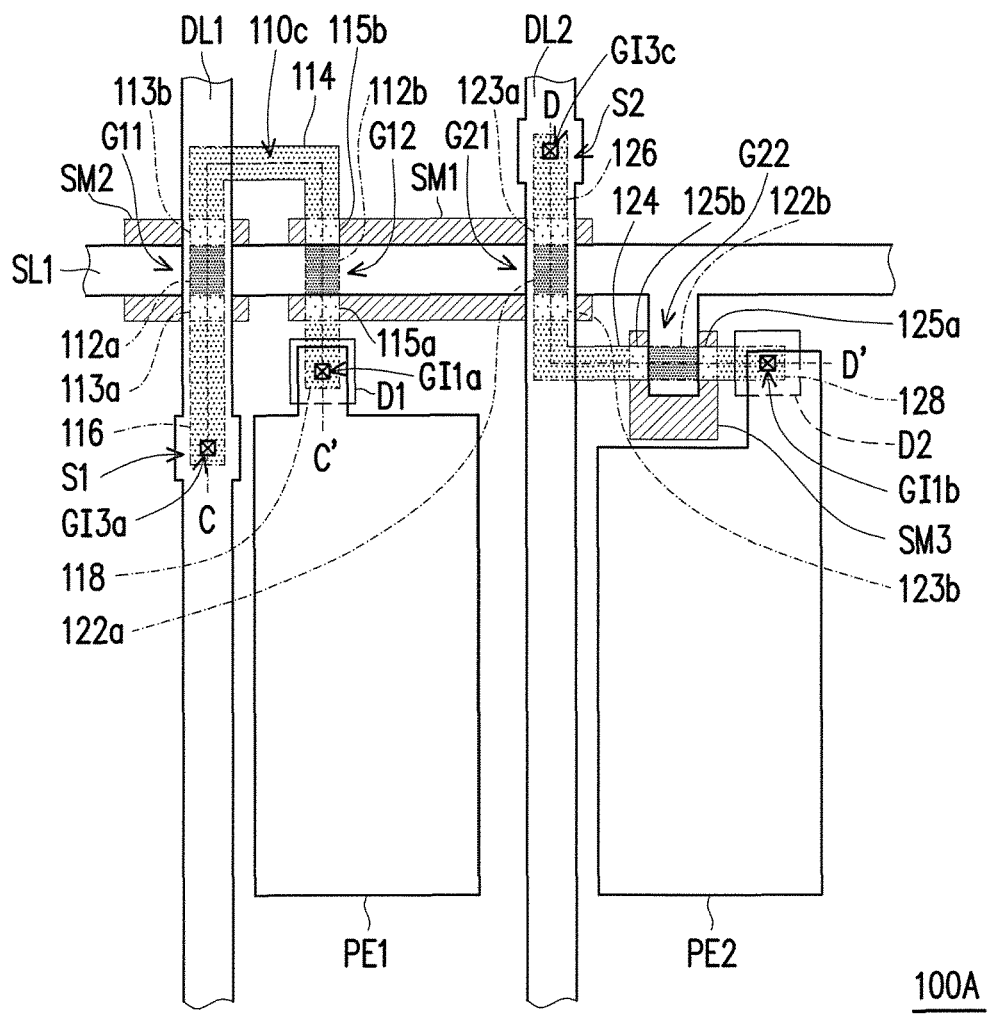
FIG. 4 is a top view of a first repeating unit of another embodiment of the invention.

FIG. 4 is a top view of a first repeating unit of another embodiment of the invention. A first repeating unit 100A of FIG. 4 is similar to the first repeating unit 100 of FIG. 1, and therefore the same or corresponding members are represented by the same or corresponding reference numerals. The main difference between the first repeating unit 100A of FIG. 4 and the first repeating unit 100 of FIG. 1 is: the shape of a second semiconductor pattern layer 120A of FIG. 4 is different from the shape of the second semiconductor pattern layer 120 of FIG. 1. The following mainly describes this difference, and the same or corresponding portions between the two are as described above with reference to the reference numerals in FIG. 4.

Referring to FIG. 4, the first repeating unit 100A includes a first scan line SL1, a first data line DL1, a second data line DL2, a first active device T1, a first pixel electrode PE1, a second active device T2, a second pixel electrode PE2, and a first shielding pattern layer SM1. The first active device T1 includes a first gate G1 electrically connected to the first scan line SL1, a first semiconductor pattern layer 110 overlapped with the first gate G1, a first source S1 electrically connected to the first semiconductor pattern layer 110 and electrically connected to the first data line DL, and a first drain D1 electrically connected to the first semiconductor pattern layer 110. The first pixel electrode PE1 is electrically connected to the first drain D1 of the first active device T1. The second active device T2 includes a second gate G2 electrically connected to the first scan line SL1, a second semiconductor pattern layer 120A overlapped with the second gate G2, a second source S2 electrically connected to the second semiconductor pattern layer 120A and electrically connected to the second data line DL2, and a second drain D2 electrically connected to the second semiconductor pattern layer 120A. The second pixel electrode PE2 is electrically connected to the second drain D2 of the second active device T2. The first shielding pattern layer SM1 is overlapped with the first semiconductor pattern layer 110 and the second semiconductor pattern layer 120A. The first shielding pattern layer SM1 is overlapped with the second data line DL2 and not overlapped with the first data line DL1.

In the embodiment of FIG. 4, the first semiconductor pattern layer 110 can optionally be a U-shaped semiconductor pattern layer. The two ends of the first semiconductor pattern layer 110 are located at one side of the first scan line SL1, and a center portion 110c of the first semiconductor pattern layer 110 is located at another side of the first scan line SL1. The difference between the first repeating units 100A and the first repeating units 100 is that, the second semiconductor pattern layer 120A of the first repeating units 100A is an L-shaped semiconductor pattern layer and not a U-shaped semiconductor pattern layer. One end of the second semiconductor pattern layer 120A is located at one side of the first scan line SL1, and another end of the second semiconductor pattern layer 120A is located at another side of the first scan line SL1. The first repeating units 100A have similar efficacies and advantages to the first repeating units 100 which are therefore not repeated herein.

Figure 5:
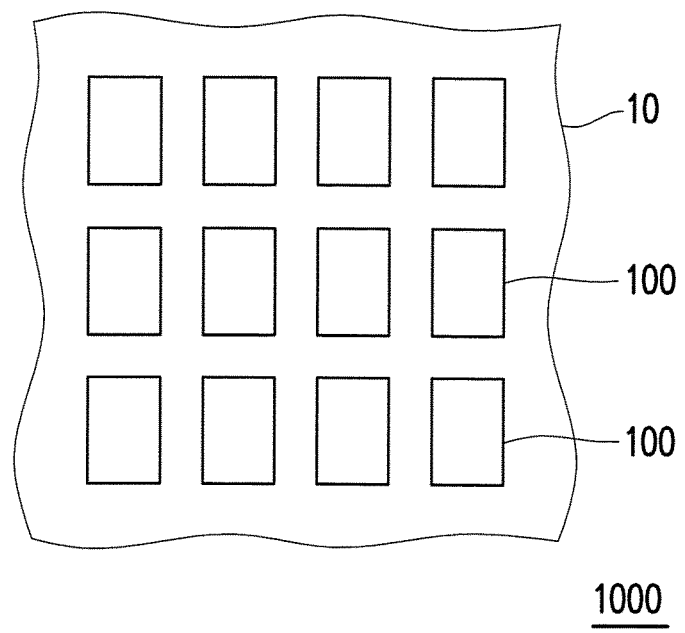
FIG. 5 is a top view of an active device array substrate of an embodiment of the invention.
Figure 6:
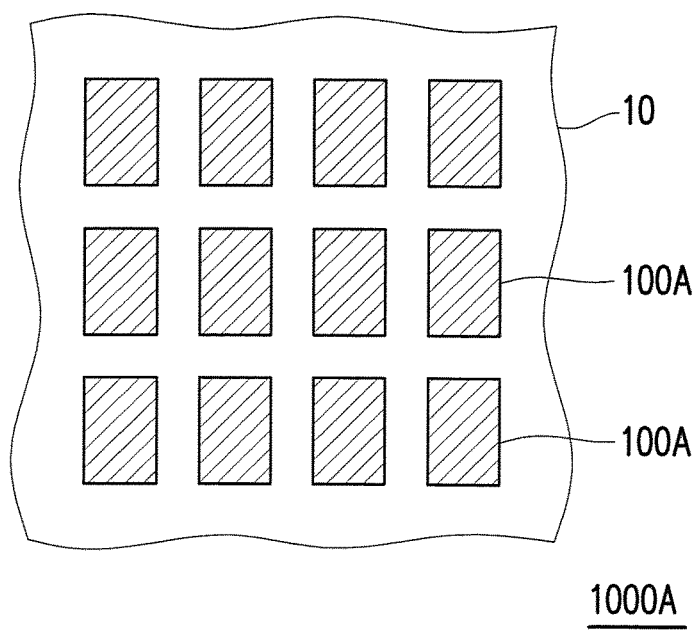
FIG. 6 is a top view of an active device array substrate of another embodiment of the invention.
Figure 7:
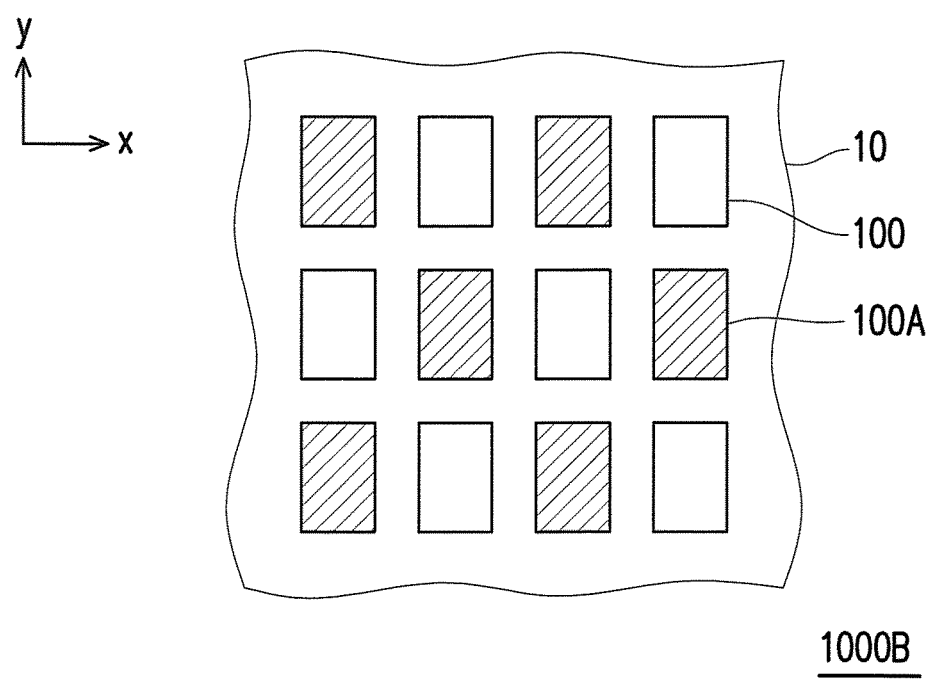
FIG. 7 is a top view of an active device array substrate of yet another embodiment of the invention.

FIG. 5 is a top view of an active device array substrate of an embodiment of the invention. An active device array substrate 1000 includes a substrate 10 and a plurality of first repeating units 100 arranged on the substrate 10 in an array. Please refer to FIG. 1, FIG. 2, and FIG. 3 and corresponding descriptions for the structure of the first repeating units 100. FIG. 6 is a top view of an active device array substrate of another embodiment of the invention. An active device array substrate 1000A includes a substrate 10 and a plurality of first repeating units 100A arranged on the substrate 10 in an array. Please refer to FIG. 4 and corresponding descriptions for the structure of the first repeating units 100A. FIG. 7 is a top view of an active device array substrate of yet another embodiment of the invention. An active device array substrate 1000B includes a substrate 10, a plurality of first repeating units 100 disposed on the substrate 10, and a plurality of first repeating units 100A disposed on the substrate 10, wherein the plurality of first repeating units 100 and 100A are arranged in an array. For instance, in the embodiment of FIG. 7, the plurality of first repeating units 100 and the plurality of first repeating units 100A can be alternately arranged along a row direction y and/or a column direction x. However, the invention is not limited thereto. In other embodiments, the first repeating units 100 and the first repeating units 100A can also be arranged in other suitable methods.

Figure 8:
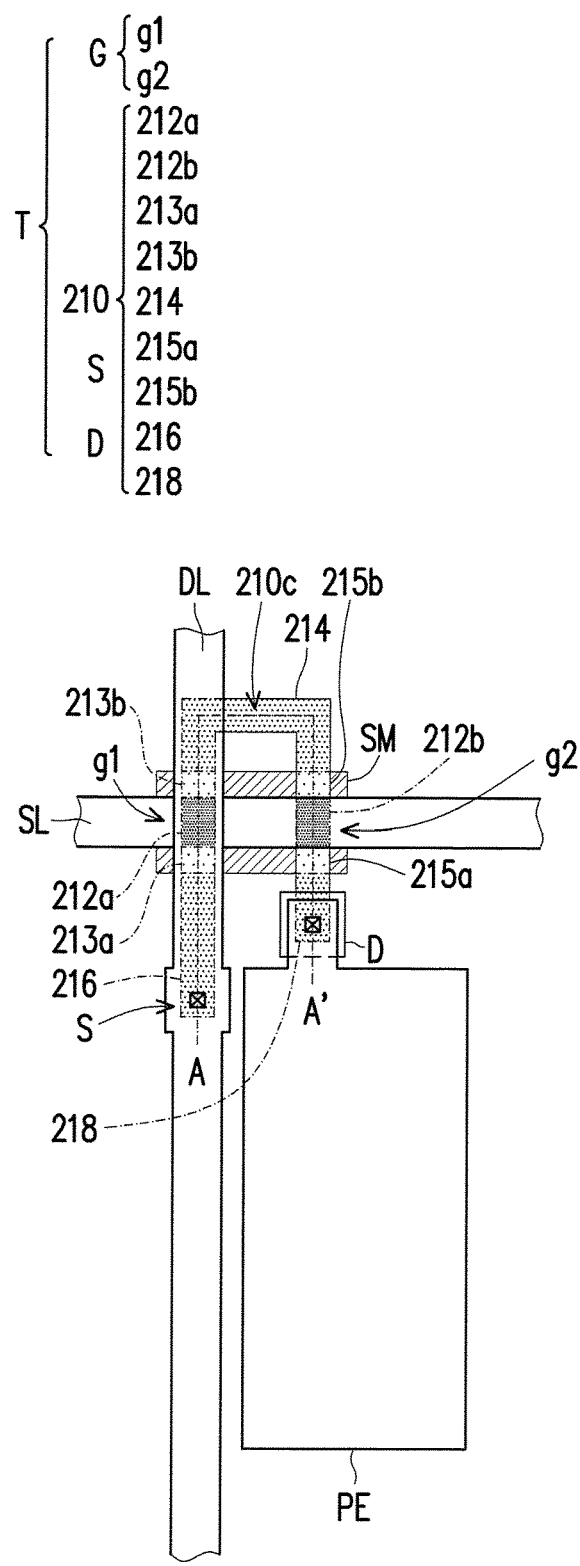
FIG. 8 is a top view of a second repeating unit of an embodiment of the invention.

FIG. 8 is a top view of a second repeating unit of an embodiment of the invention. Referring to FIG. 8, a second repeating unit 200 includes at least one scan line SL, at least one data line DL, at least one active device T electrically connected to the scan line SL and the data line DL, at least one pixel electrode PE electrically connected to the at least one active device T, and at least one shielding pattern layer SM disposed corresponding to the active device T.

The active device T includes a gate G electrically connected to the scan line SL, a semiconductor pattern layer 210 overlapped with the gate G, a source S electrically connected to the semiconductor pattern layer 210 and the data line DL, and a drain D electrically connected to the semiconductor pattern layer 210. The pixel electrode PE is electrically connected to the drain D of the active device T. In the embodiment of FIG. 8, the active device T can optionally be a dual-gate thin-film transistor or other multi-gate thin-film transistor. The gate G of the active device T includes two gate portions g1 and g2. The two gate portions g1 and g2 can be two different portions of the scan line SL. The first semiconductor pattern layer 210 includes a connecting portion 214, a source portion 216 and a drain portion 218, and two channel portions 212a and 212b respectively overlapped with the two gate portions g1 and g2. The channel portion 212a is disposed between the source portion 216 and the connecting portion 214. The connecting portion 214 is disposed between the two channel portions 212a and 212b. The connecting portion 214 can be a heavily-doped portion. The channel portion 212b is disposed between the connecting portion 214 and the drain portion 218. The semiconductor pattern layer 210 further includes lightly-doped portions 213a and 213b and lightly-doped portions 215a and 215b. The lightly-doped portions 213a and 213b are located between the source portion 216 and the connecting portion 214, and the lightly-doped portions 213a and 213b are respectively located at two different sides of the channel portion 212a. The lightly-doped portions 215a and 215b are located between the drain portion 218 and the connecting portion 214, and the lightly-doped portions 215a and 215b are respectively located at two different sides of the channel portion 212b. The source portion 216 of the semiconductor pattern layer 210 is electrically connected to the source S. The source S can be a portion of the data line DL. The drain portion 218 of the semiconductor pattern layer 210 is electrically connected to the drain D. The shielding pattern layer SM may be continuously extended from under the channel portion 212a to under the channel portion 212b and shields the lightly-doped portions 213a, 213b, 215a, and 215b. The plurality of second repeating units 200 can be arranged into an active device array substrate, and can also be arranged with at least one of the first repeating units 100 and 100A into an active device array substrate as described with reference to FIG. 9, FIG. 10, and FIG. 11 in the following.

Figure 9:
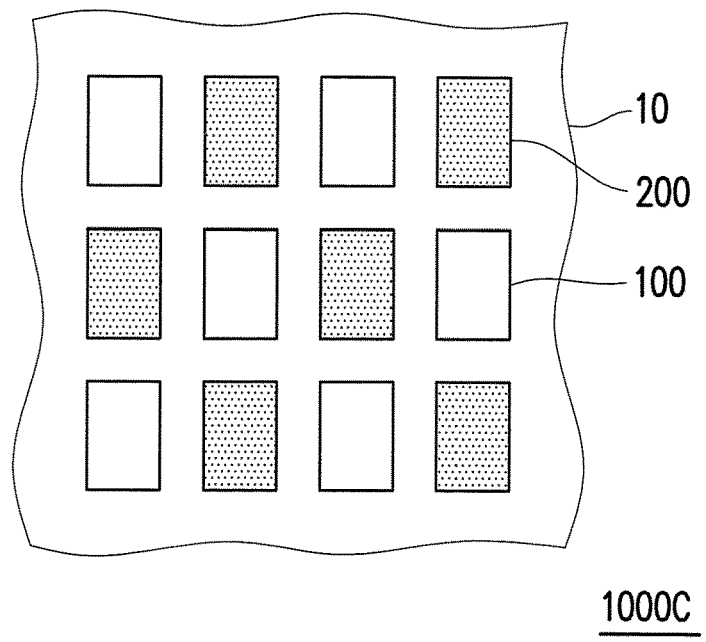
FIG. 9 is a top view of an active device array substrate of still yet another embodiment of the invention.

FIG. 9 is a top view of an active device array substrate of still yet another embodiment of the invention. An active device array substrate 1000C includes a substrate 10, a plurality of first repeating units 100 disposed on the substrate 10, and a plurality of second repeating units 200 disposed on the substrate 10, wherein the first repeating units 100 and the second repeating units 200 are arranged in an array. For instance, in the embodiment of FIG. 9, the plurality of first repeating units 100 and the plurality of second repeating units 200 can be alternately arranged along the row direction y and/or the column direction x. However, the invention is not limited thereto. In other embodiments, the first repeating units 100 and the second repeating units 200 can also be arranged in other suitable methods.

Figure 10:
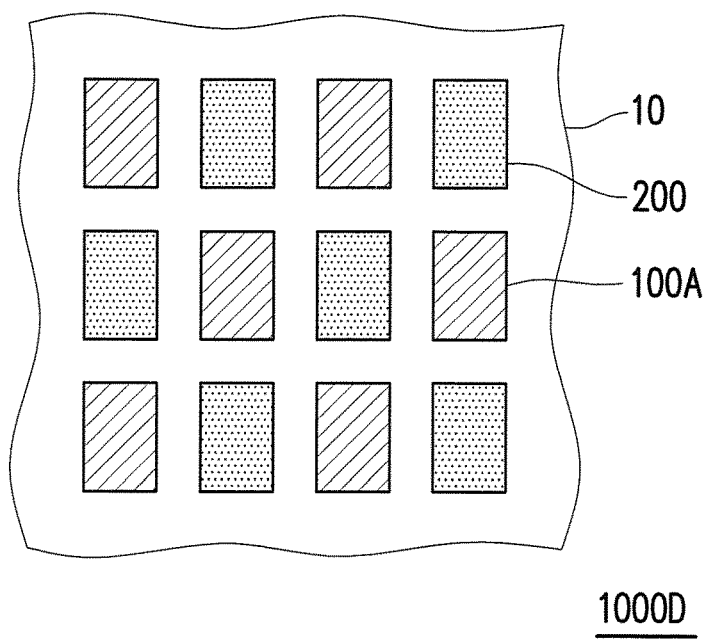
FIG. 10 is a top view of an active device array substrate of an embodiment of the invention.

FIG. 10 is a top view of an active device array substrate of an embodiment of the invention. An active device array substrate 1000D includes a substrate 10, a plurality of first repeating units 100A disposed on the substrate 10, and a plurality of second repeating units 200 disposed on the substrate 10, wherein the first repeating units 100A and the second repeating units 200 are arranged in an array. For instance, in the embodiment of FIG. 10, the plurality of first repeating units 100A and the plurality of second repeating units 200 can be alternately arranged along the row direction y and/or the column direction x. However, the invention is not limited thereto. In other embodiments, the first repeating units 100A and the second repeating units 200 can also be arranged in other suitable methods.

Figure 11:
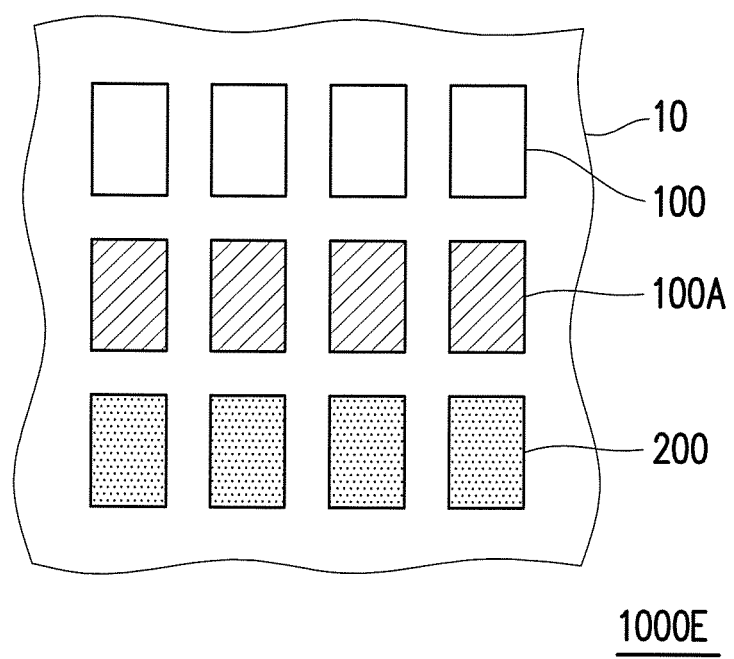
FIG. 11 is a top view of an active device array substrate of another embodiment of the invention.

FIG. 11 is a top view of an active device array substrate of another embodiment of the invention. An active device array substrate 1000E includes a substrate 10, a plurality of first repeating units 100 disposed on the substrate 10, a plurality of first repeating units 100A, and a plurality of second repeating units 200 disposed on the substrate 10, wherein the first repeating units 100 and 100A and the second repeating units 200 are arranged in an array. For instance, in the embodiment of FIG. 11, the plurality of first repeating units 100 can be arranged in the nth column, the plurality of first repeating units 100A can be arranged in the (n+1)th column, and the plurality of second repeating units 200 can be arranged in the (n+2)th column, wherein n is a positive integer greater than or equal to 1. However, the invention is not limited thereto. In other embodiments, the first repeating units 100, the first repeating units 100A, and the second repeating units 200 can also be arranged in other suitable methods.

Figure 12:
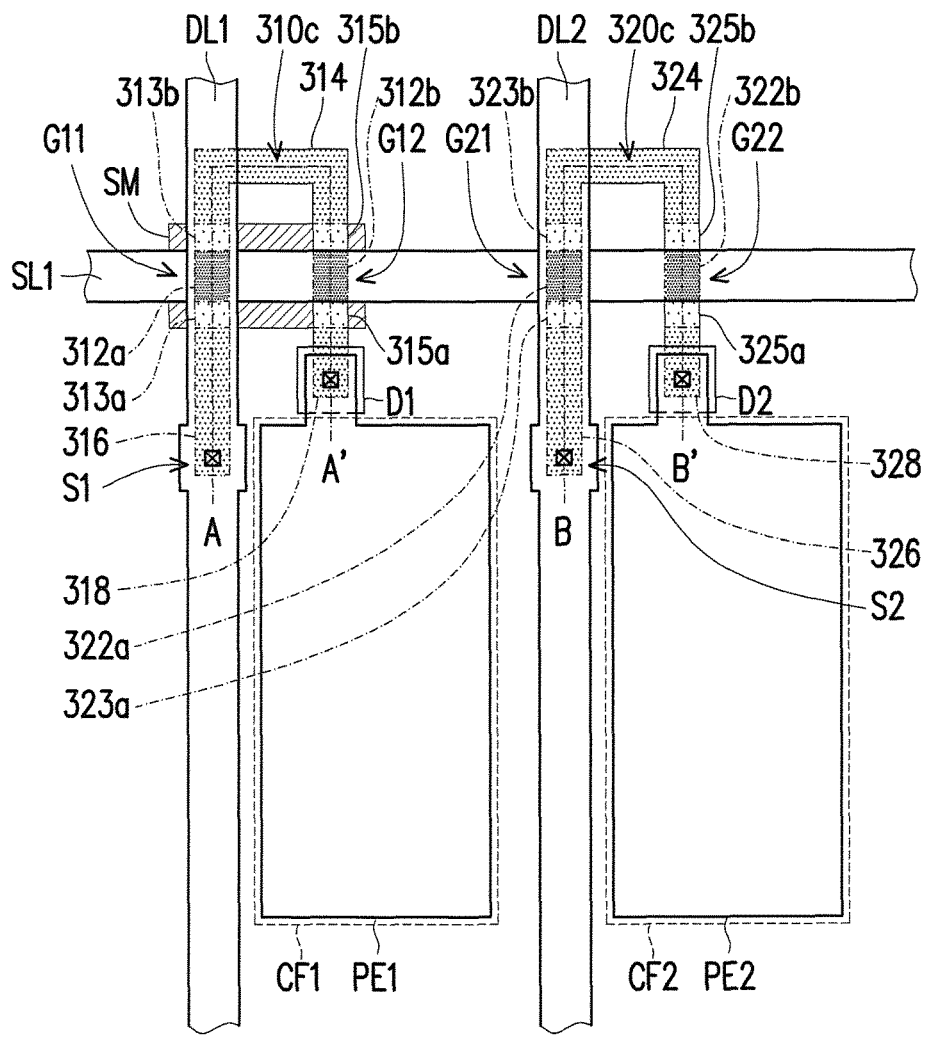
FIG. 12 is a top view of a first repeating unit of yet another embodiment of the invention.

FIG. 12 is a top view of a first repeating unit of yet another embodiment of the invention. Referring to FIG. 12, a first repeating unit 300 includes a first scan line SL1, a first data line DL1, a second data line DL2, a first active device T1, a first pixel electrode PE1, a second active device T2, a second pixel electrode PE2, and a shielding pattern layer SM. The first scan line SL1 is staggered with the first and second data lines DL1 and DL2. For instance, in the present embodiment, the first and second data lines DL1 and DL2 can be parallel to each other, and the first scan line SL1 and the first data line DL1 can be perpendicular to each other, but the invention is not limited thereto. In other embodiments, the first scan line SL1 and the first and second data lines DL1 and DL2 can also be disposed in other suitable methods. Out of consideration for conductivity, the first scan line SL1 and the first and second data lines DL1 and DL2 generally adopt a metal material, but the invention is not limited thereto. In other embodiments, the first scan line SL1 and the first and second data lines DL1 and DL2 can also adopt other conductive materials, such as an alloy, nitride of a metal material, oxide of a metal material, oxynitride of a metal material, or stacked layers of a metal material and other conductive materials.

The first active device T1 includes a first gate G1 electrically connected to the first scan line SL1, a first semiconductor pattern layer 310 overlapped with the first gate G1, a first source S1 electrically connected to the first semiconductor pattern layer 310 and electrically connected to the first data line DL1, and a first drain D1 electrically connected to the first semiconductor pattern layer 310. The first pixel electrode PE1 is electrically connected to the first drain D1 of the first active device T1. In the present embodiment, the first active device T1 can optionally be a dual-gate thin-film transistor or other multi-gate thin-film transistor. The first gate G1 of the first active device T1 includes two gate portions G11 and G12. The two gate portions G11 and G12 can be two different portions of the first scan line SL1. The first semiconductor pattern layer 310 includes two channel portions 312a and 312b respectively overlapped with the two gate portions G11 and G12, a connecting portion 314, a source portion 316, and a drain portion 318. The channel portion 312a is disposed between the source portion 316 and the connecting portion 314. The connecting portion 314 is disposed between the two channel portions 312a and 312b. The connecting portion 314 can be a heavily-doped portion to reduce resistance between the two channel portions 312a and 312b. The channel portion 312b is disposed between the connecting portion 314 and the drain portion 318. The first semiconductor pattern layer 310 further includes lightly-doped portions 313a and 313b and lightly-doped portions 315a and 315b. The lightly-doped portions 313a and 313b are located between the source portion 316 and the connecting portion 314, and the lightly-doped portions 313a and 313b are respectively located at two different sides of the channel portion 312a. The lightly-doped portions 315a and 315b are located between the drain portion 318 and the connecting portion 314, and the lightly-doped portions 315a and 315b are respectively located at two different sides of the channel portion 312b. The lightly-doped portions 313a, 313b, 315a, and 315b can inhibit leakage current of the first active device T1.

Similarly, the second active device T2 includes a second gate G2 electrically connected to the first scan line SL1, a second semiconductor pattern layer 320 overlapped with the second gate G2, a second source S2 electrically connected to the second semiconductor pattern layer 320 and electrically connected to the second data line DL2, and a second drain D2 electrically connected to the second semiconductor pattern layer 320. The second pixel electrode PE2 is electrically connected to the second drain D2 of the second active device T2. In the present embodiment, the second active device T2 can optionally be a dual-gate thin-film transistor or other multi-gate thin-film transistor. The second gate G2 of the second active device T2 includes two gate portions G21 and G22. The two gate portions G21 and G22 can be two different portions of the first scan line SL1. The second semiconductor pattern layer 320 includes a connecting portion 324, a source portion 326 and a drain portion 328, and two channel portions 322a and 322b respectively overlapped with the two gate portions G21 and G22. The channel portion 322a is disposed between the source portion 326 and the connecting portion 324. The connecting portion 324 is disposed between the two channel portions 322a and 322b. The connecting portion 324 can be a heavily-doped portion to reduce resistance between the two channel portions 322a and 322b. The channel portion 322b is disposed between the connecting portion 324 and the drain portion 328. The second semiconductor pattern layer 320 further includes lightly-doped portions 323a and 323b and lightly-doped portions 325a and 325b. The lightly-doped portions 323a and 323b are located between the source portion 326 and the connecting portion 324, and the lightly-doped portions 323a and 323b are respectively located at two different sides of the channel portion 322a. The lightly-doped portions 325a and 325b are located between the drain portion 328 and the connecting portion 324, and the lightly-doped portions 325a and 325b are respectively located at two different sides of the channel portion 322b. The lightly-doped portions 323a, 323b, 325a, and 325b can inhibit leakage current of the second active device T2.

In the present embodiment, the first semiconductor pattern layer 310 and the second semiconductor pattern layer 320 can optionally both be U-shaped semiconductor pattern layers. More specifically, the first and second semiconductor pattern layers 310 and 320 can be two U-shaped semiconductor pattern layers for which the openings respectively face the first and second pixel electrodes PE1 and PE2. The two ends of the first semiconductor pattern layer 310 can be located at one side of the first scan line SL1, and a center portion 310c of the first semiconductor pattern layer 310 is located at another side of the first scan line SL1. The two ends of the second semiconductor pattern layer 320 can be located at one side of the first scan line SL1, and a center portion 320c of the second semiconductor pattern layer 320 is located at another side of the first scan line SL1. It should be mentioned that, the shapes of the first and second semiconductor pattern layers 310 and 320 are only exemplary to the invention and are not intended to limit the invention. In other embodiments, the first and second semiconductor pattern layers 310 and 320 can also have other suitable shapes; moreover, the shapes of the first and second semiconductor pattern layers 310 and 320 can also be different.

It should be mentioned that, the shielding pattern layer SM is overlapped with the first semiconductor pattern layer 310, and the second semiconductor pattern layer 320 is not overlapped with any shielding pattern layer, that is, no shielding pattern layer is overlapped with the second semiconductor pattern layer 320 between the second semiconductor pattern layer 320 and the substrate 10. Since the second pixel structure (i.e., the second active device T2 and the second pixel electrode PE2) does not have any shielding pattern layer, the coupling capacitance between the second pixel structure and the first pixel structure (i.e., the first active device T1, the first pixel electrode PE1, and the shielding pattern layer SM) is small, thus facilitating the reduction of loading of a display panel adopting the first repeating units 300, and the aperture ratio of the display panel can be increased at the same time.

The first repeating units 300 of the present embodiment further include a first color filter pattern layer CF1 disposed corresponding to the first pixel electrode PE1 and a second color filter pattern layer CF2 disposed corresponding to the second pixel electrode PE2. In the present embodiment, the first color filter pattern layer CF1 and the first pixel electrode PE1 can be disposed on the same substrate, and the second color filter pattern layer CF2 and the second pixel electrode PE2 can be disposed on the same substrate to form a color filter on array (COA) structure. However, the invention is not limited thereto, and in other embodiments, the first and second color filter pattern layers CF1 and CF2 can also be disposed on another substrate opposite to the substrate.

In the present embodiment, the first color filter pattern layer CF1 corresponding to the first pixel electrode PE1 can optionally be a red or green filter pattern layer, and the second color filter pattern layer CF2 corresponding to the second pixel electrode PE2 can optionally be a blue filter pattern layer. In other words, the second pixel structure (i.e., the second active device T2 and the second pixel electrode PE2) having a higher aperture ratio corresponds to the blue filter pattern layer, and the first pixel structure (i.e., the first active device T1, the first pixel electrode PE1, and the shielding pattern layer SM) having a lower aperture ratio corresponds to the red or green filter pattern layer. Since the human eye is more sensitive to red light and green light than blue light, i.e., in terms of the same intensity of red light (or green light) and blue light, the brightness of red light (or green light) perceived by the human eye is higher and the brightness of blue light perceived is lower. Therefore, by using the second pixel structure having a higher aperture ratio with the blue filter pattern layer less sensitive to the human eye, and by using the first pixel structure having a lower aperture ratio with the red (or green) filter pattern layer more sensitive to the human eye, the color rendering properties of a display panel adopting the first repeating units 300 can be improved.

Figure 13:
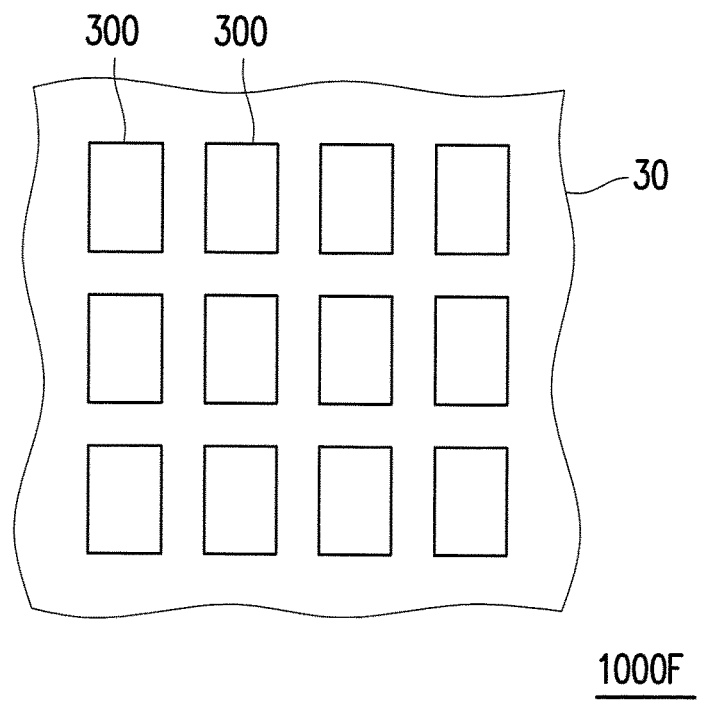
FIG. 13 is a top view of an active device array substrate of another embodiment of the invention.
Figure 14:
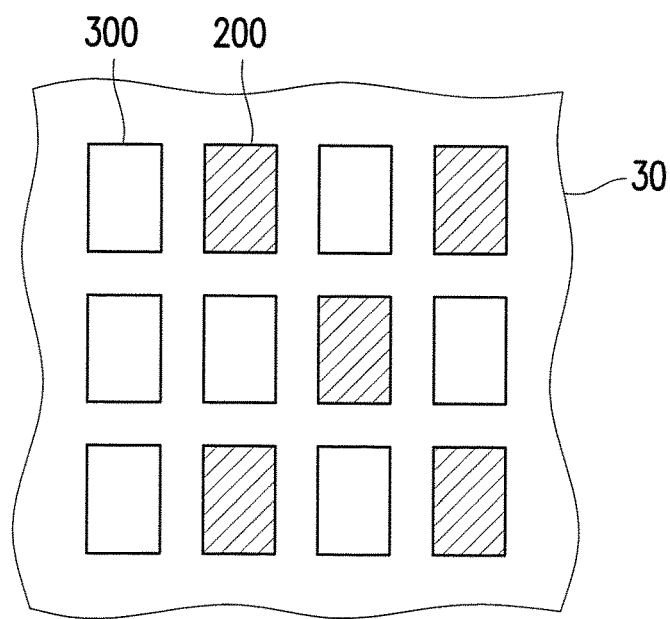
FIG. 14 is a top view of an active device array substrate of yet another embodiment of the invention.

FIG. 13 is a top view of an active device array substrate of another embodiment of the invention. Referring to FIG. 13, an active device array substrate 1000F includes a substrate 30 and a plurality of first repeating units 300 arranged on the substrate 30 in an array. Suitable materials for the substrate 30 are as described for the suitable materials for the substrate 10. Please refer to FIG. 12 and corresponding descriptions for the structure of the first repeating units 300. FIG. 14 is a top view of an active device array substrate of yet another embodiment of the invention. An active device array substrate 1000G includes a substrate 30, a plurality of first repeating units 300 disposed on the substrate 30, and a plurality of second repeating units 200 disposed on the substrate 10. Please refer to FIG. 8 and corresponding descriptions for the structure of the second repeating units 200. The first repeating units 300 are arranged with the second repeating units 200 in an array. For instance, in the embodiment of FIG. 14, the plurality of first repeating units 300 and the plurality of second repeating units 200 can be alternately arranged along the row direction y and/or the column direction x. However, the invention is not limited thereto. In other embodiments, the first repeating units 300 and the second repeating units 200 can also be arranged in other suitable methods. Both the active device array substrates 1000F and 1000G have the advantages of low loading and high aperture ratio described above.

Figure 15:
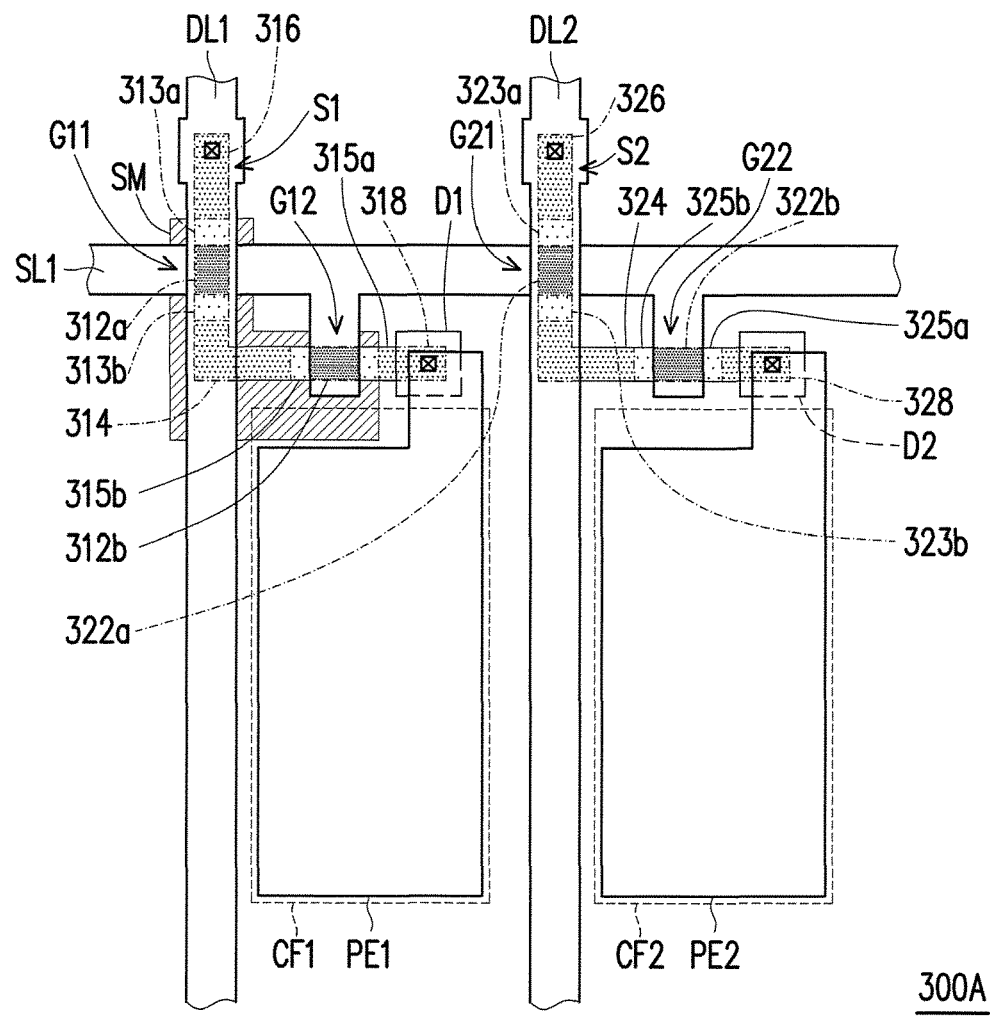
FIG. 15 is a top view of a first repeating unit of still yet another embodiment of the invention.

FIG. 15 is a top view of a first repeating unit of still yet another embodiment of the invention. A first repeating unit 300A of FIG. 15 is similar to the first repeating unit 300 of FIG. 12, and therefore the same or corresponding members are represented by the same or corresponding reference numerals. The main difference between the first repeating unit 300A of FIG. 15 and the first repeating unit 300 of FIG. 12 is the shapes of first and second semiconductor pattern layers 310A and 320A of the first repeating unit 300A are different from the shapes of the first and second semiconductor pattern layers 310 and 320 of the second repeating unit 300. The following mainly describes this difference, and the same portions between the two are as described above with reference to the reference numerals in FIG. 15 and are therefore not repeated herein.

Referring to FIG. 15, the first repeating unit 300A includes a first scan line SL1, a first data line DL1, a second data line DL2, a first active device T1, a first pixel electrode PE1, a second active device T2, a second pixel electrode PE2, and a shielding pattern layer SM. The first active device T1 includes a first gate G1 electrically connected to the first scan line SL1, a first semiconductor pattern layer 310A overlapped with the first gate G1, a first source S1 electrically connected to the first semiconductor pattern layer 310A and electrically connected to the first data line DL1, and a first drain D1 electrically connected to the first semiconductor pattern layer 310A. The first pixel electrode PE1 is electrically connected to the first drain D1 of the first active device T1. The second active device T2 includes a second gate G2 electrically connected to the first scan line SL1, a second semiconductor pattern layer 320A overlapped with the second gate G2, a second source S2 electrically connected to the second semiconductor pattern layer 320A and electrically connected to the second data line DL2, and a second drain D2 electrically connected to the second semiconductor pattern layer 320A. The second pixel electrode PE2 is electrically connected to the second drain D2 of the second active device T2. The shielding pattern layer SM is overlapped with the first semiconductor pattern layer 310A. The second semiconductor pattern layer 320A is not overlapped with any shielding pattern layer SM, that is, no shielding pattern layer is overlapped with the second semiconductor pattern layer 320A.

The difference between the present embodiment and the first repeating unit 300 of FIG. 12 is that, the first and second semiconductor pattern layers 310A and 320A of the first repeating units 300A can optionally both be L-shaped semiconductor pattern layers. More specifically, one end of the first semiconductor pattern layer 310A is located at one side of the first scan line SL1, and another end of the first semiconductor pattern layer 310A is located at another side of the first scan line SL1. One end of the second semiconductor pattern layer 320A is located at one side of the first scan line SL1, and another end of the second semiconductor pattern layer 320A is located at another side of the first scan line SL.

The first repeating unit 300A of FIG. 15 can be used to replace the first repeating unit 300 in the active device array substrates 1000F and 1000G of FIG. 13 and FIG. 14 to form various active device array substrates, which are therefore not shown again. Moreover, when the first repeating units 300A replace the first repeating units 300 of FIG. 14 and are arranged with the second repeating units 200 in an array, the second repeating units 200 (as shown in FIG. 8) can further include a filter pattern layer (not shown) corresponding to the pixel electrode PE thereof, and the color of the filter pattern layer corresponding to the pixel electrode PE can be decided according to actual need. The various active device array substrates formed by the first repeating units 300A have similar efficacies and advantages to the active device array substrate 1000F which are also not repeated herein.

Figure 16:
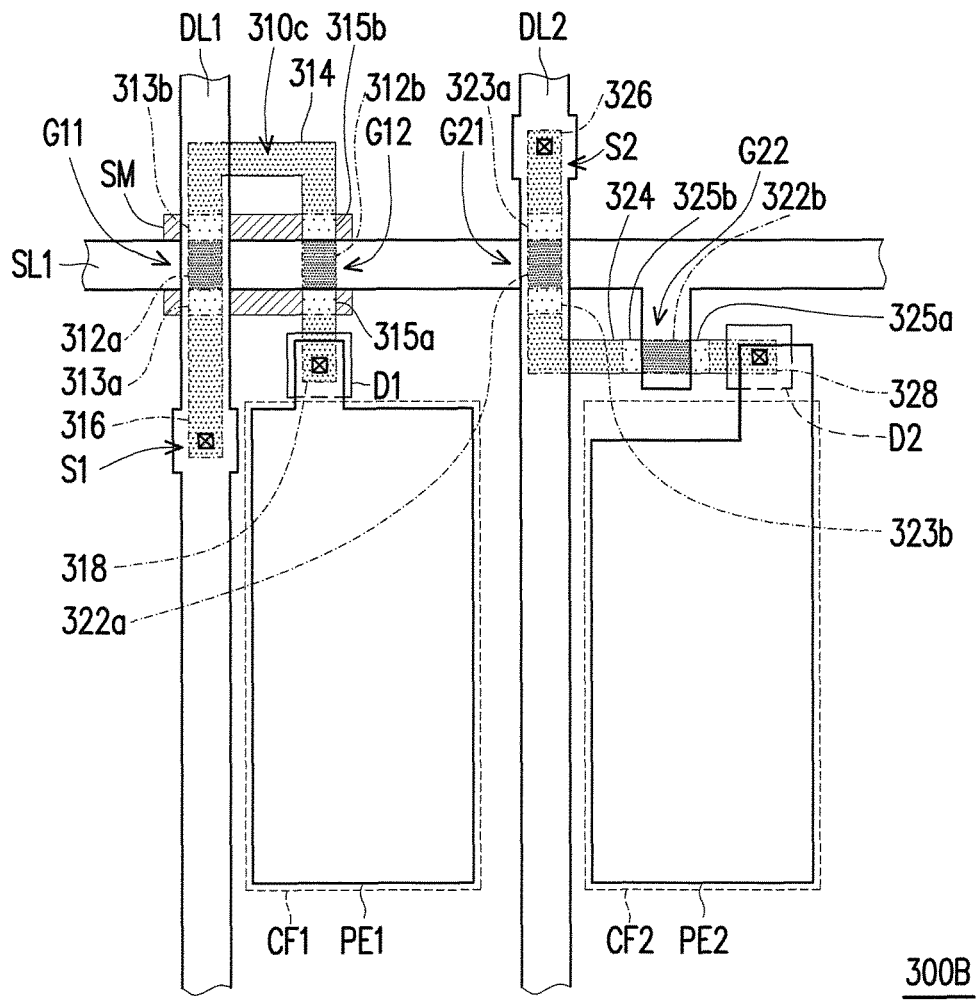
FIG. 16 is a top view of a first repeating unit of an embodiment of the invention.

FIG. 16 is a top view of a first repeating unit of an embodiment of the invention. A first repeating unit 300B of FIG. 16 is similar to the first repeating unit 300 of FIG. 12, and therefore the same or corresponding members are represented by the same or corresponding reference numerals. The main difference between the first repeating unit 300B of FIG. 16 and the first repeating unit 300 of FIG. 12 is the shape of a second semiconductor pattern layer 320B of the first repeating unit 300B is different from the shape of the second semiconductor pattern layer 320 of the second repeating unit 300. The following mainly describes this difference, and the same portions between the two are as described above with reference to the reference numerals in FIG. 16 and are therefore not repeated herein.

Referring to FIG. 16, the first repeating unit 300B includes a first scan line SL1, a first data line DL1, a second data line DL2, a first active device T1, a first pixel electrode PE1, a second active device T2, a second pixel electrode PE2, and a shielding pattern layer SM. The first active device T1 includes a first gate G1 electrically connected to the first scan line SL1, a first semiconductor pattern layer 310 overlapped with the first gate G1, a first source S1 electrically connected to the first semiconductor pattern layer 310 and electrically connected to the first data line DL1, and a first drain D1 electrically connected to the first semiconductor pattern layer 310. The first pixel electrode PE1 is electrically connected to the first drain D1 of the first active device T1. The second active device T2 includes a second gate G2 electrically connected to the first scan line SL1, a second semiconductor pattern layer 320B overlapped with the second gate G2, a second source S2 electrically connected to the second semiconductor pattern layer 320B and electrically connected to the second data line DL2, and a second drain D2 electrically connected to the second semiconductor pattern layer 320B. The second pixel electrode PE2 is electrically connected to the second drain D2 of the second active device T2. The shielding pattern layer SM is overlapped with the first semiconductor pattern layer 310. The second semiconductor pattern layer 320B is not overlapped with any shielding pattern layer SM, that is, no shielding pattern layer is overlapped with the second semiconductor pattern layer 320B.

The difference between the present embodiment and the first repeating unit 300 of FIG. 12 is that, the shapes of the first and second semiconductor pattern layers 310 and 320B of the first repeating unit 300B can optionally be different from each other. For instance, the first semiconductor pattern layer 310 can be a U-shaped semiconductor pattern layer, and the second semiconductor pattern layer 320B can be an L-shaped semiconductor pattern layer. More specifically, the two ends of the first semiconductor pattern layer 310 can be located at one side of the first scan line SL1, the center portion 310c of the first semiconductor pattern layer 310 is located at another side of the first scan line SL1, one end of the second semiconductor pattern layer 320B is located at one side of the first scan line SL1, and another end of the second semiconductor pattern layer 320B is located at another side of the first scan line SL1. However, the invention is not limited thereto, and in another embodiment of the invention, the first semiconductor pattern layer 310 can also be an L-shaped semiconductor pattern layer, and the second semiconductor pattern layer 320B can also be a U-shaped semiconductor pattern layer. Moreover, the invention also does not limit the first and second semiconductor pattern layers 310 and 320B to be L-shaped or U-shaped, and the first and second semiconductor pattern layers 310 and 320B can also be other suitable shapes.

The first repeating unit 300B of FIG. 16 can be used to replace the first repeating unit 300 in the active device array substrates 1000F and 1000G of FIG. 13 and FIG. 14 to form various active device array substrates, which are therefore not shown again. Moreover, when the first repeating units 300B replace the first repeating units 300 of FIG. 14 and are arranged with the second repeating units 200 in an array, the second repeating units 200 (as shown in FIG. 8) can further include a filter pattern layer (not shown) corresponding to the pixel electrode PE thereof, and the color of the filter pattern layer corresponding to the pixel electrode PE can be decided according to actual need. The various active device array substrates formed by the first repeating units 300B have similar efficacies and advantages to the active device array substrate 1000F which are also not repeated herein.

Figure 17:
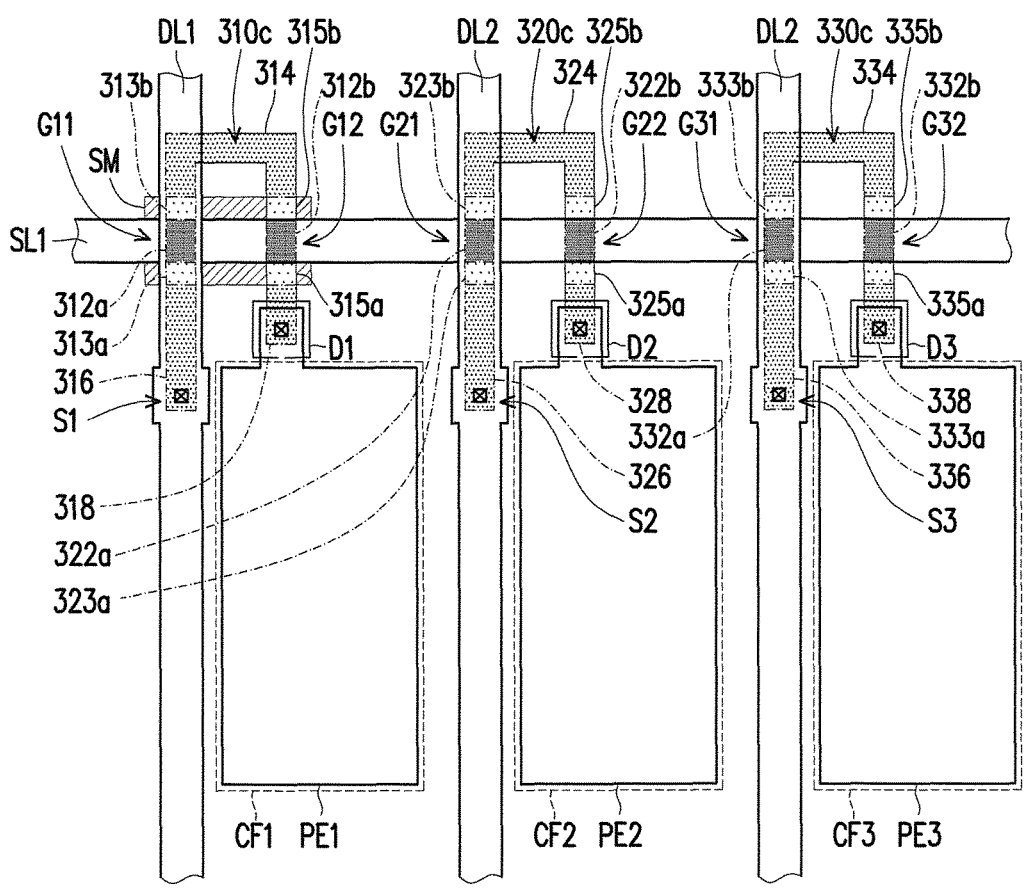
FIG. 17 is a top view of a first repeating unit of another embodiment of the invention.

FIG. 17 is a top view of a first repeating unit of another embodiment of the invention. A first repeating unit 300C of FIG. 17 is similar to the first repeating unit 300 of FIG. 12, and therefore the same or corresponding members are represented by the same or corresponding reference numerals. The main difference between the first repeating unit 300C of FIG. 17 and the first repeating unit 300 of FIG. 12 is the first repeating unit 300C further includes a third data line DL3, a third active device T3, and a third pixel electrode PE3. The following mainly describes this difference, and the same portions between the two are as described above with reference to the reference numerals in FIG. 17 and are not repeated herein.

Referring to FIG. 17, the first repeating unit 300C includes a first scan line SL1, a first data line DL1, a second data line DL2, a first active device T1, a first pixel electrode PE1, a second active device T2, a second pixel electrode PE2, and a shielding pattern layer SM. The first active device T1 includes a first gate G1 electrically connected to the first scan line SL1, a first semiconductor pattern layer 310 overlapped with the first gate G1, a first source S1 electrically connected to the first semiconductor pattern layer 310 and electrically connected to the first data line DL1, and a first drain D1 electrically connected to the first semiconductor pattern layer 310. The first pixel electrode PE1 is electrically connected to the first drain D1 of the first active device T1. The second active device T2 includes a second gate G2 electrically connected to the first scan line SL1, a second semiconductor pattern layer 320 overlapped with the second gate G2, a second source S2 electrically connected to the second semiconductor pattern layer 320 and electrically connected to the second data line DL2, and a second drain D2 electrically connected to the second semiconductor pattern layer 320. The second pixel electrode PE2 is electrically connected to the second drain D2 of the second active device T2. The shielding pattern layer SM is overlapped with the first semiconductor pattern layer 310. The second semiconductor pattern layer 320 is not overlapped with any shielding pattern layer, that is, no shielding pattern layer is overlapped with the second semiconductor pattern layer 320 between the second semiconductor pattern layer 320 and the substrate 10.

The difference between the present embodiment and the first repeating unit 300 is that, the first repeating unit 300C further includes a third data line DL3, a third active device T3, and a third pixel electrode PE3. The third active device T3 includes a third gate G3 electrically connected to the first scan line SL1, a third semiconductor pattern layer 330 overlapped with the third gate G3, a third source S3 electrically connected to the third semiconductor pattern layer 330 and the third data line DL3, and a third drain D3 electrically connected to the third semiconductor pattern layer 330. The third pixel electrode PE3 is electrically connected to the third drain D3 of the third active device T3. In particular, the third semiconductor pattern layer 330 is not overlapped with any shielding pattern layer, that is, no shielding pattern layer is overlapped with the third semiconductor pattern layer 330.

In the present embodiment, the first active device T1 can optionally be a dual-gate thin-film transistor or other multi-gate thin-film transistor. The first gate G1 of the first active device T1 includes two gate portions G31 and G32. The two gate portions G31 and G32 can be two different portions of the first scan line SL1. The third semiconductor pattern layer 330 includes a connecting portion 334, a source portion 336 and a drain portion 338, and two channel portions 332a and 332b respectively overlapped with the two gate portions G31 and G32. The channel portion 332a is disposed between the source portion 336 and the connecting portion 334. The connecting portion 334 is disposed between the two channel portions 332a and 332b. The connecting portion 334 can be a heavily-doped portion to reduce resistance between the two channel portions 332a and 332b. The channel portion 332b is disposed between the connecting portion 334 and the drain portion 338. The third semiconductor pattern layer 330 further includes lightly-doped portions 333a and 333b and lightly-doped portions 335a and 335b. The lightly-doped portions 333a and 333b are located between the source portion 336 and the connecting portion 334, and the lightly-doped portions 333a and 333b are respectively located at two different sides of the channel portion 332a. The lightly-doped portions 335a and 335b are located between the drain portion 338 and the connecting portion 334, and the lightly-doped portions 335a and 335b are respectively located at two different sides of the channel portion 332b. The lightly-doped portions 333a, 333b, 335a, and 335b can inhibit leakage current of the third active device T3. Moreover, the first repeating unit 300C further includes a third color filter pattern layer CF3 disposed corresponding to the third pixel electrode PE3. If the second color filter pattern layer CF2 can optionally be a blue filter pattern layer, then the first color filter pattern layer CF1 can be one of a red or green filter pattern layer, and the third color filter pattern layer CF3 can be the other one of the red or green filter pattern layer, but the invention is not limited thereto.

The first repeating unit 300C of FIG. 17 can be used to replace the first repeating unit 300 in the active device array substrates 1000F and 1000G of FIG. 13 and FIG. 14 to form various active device array substrates, which are therefore not shown again. Moreover, when the first repeating units 300C replace the first repeating units 300 of FIG. 14 and are arranged with the second repeating units 200, the second repeating units 200 (as shown in FIG. 8) can further include a filter pattern layer (not shown) corresponding to the pixel electrode PE thereof, and the color of the filter pattern layer corresponding to the pixel electrode PE can be decided according to actual need. The various active device array substrates formed by the first repeating units 300C have similar efficacies and advantages to the active device array substrate 1000F which are also not repeated herein.

Based on the above, in the active device array substrate of an embodiment of the invention, the first shielding pattern layer is overlapped with an adjacent first semiconductor pattern layer and second semiconductor pattern layer at the same time. Accordingly, the capacitance between the second semiconductor pattern layer and the second shielding pattern layer can compensate the capacitance between the first semiconductor pattern layer and the first shielding pattern layer and influence to the first pixel electrode level, and as a result the issue of crosstalk is alleviated.

In the active device array substrate of another embodiment of the invention, the shielding pattern layer is overlapped with the first semiconductor pattern layer, and the second semiconductor pattern layer is not overlapped with any shielding pattern layer. Since the second pixel structure including the second active device and the second pixel electrode does not have any shielding pattern layer, the coupling capacitance between the second pixel structure and the first pixel structure including the first active device, the first pixel electrode, and the shielding pattern layer is small. As a result, loading of a display panel can be reduced, and the aperture ratio of the display panel can be increased at the same time.

Although the invention has been described with reference to the above embodiments, it will be apparent to one of ordinary skill in the art that modifications to the described embodiments can be made without departing from the spirit of the invention. Accordingly, the scope of the invention is defined by the attached claims not by the above detailed descriptions.

What is claimed is:

1. An active device array substrate, comprising:
   a first scan line; extend across
   a first data line and a second data line;
   a first active device, comprising:
      a first gate electrically connected to the first scan line;
      a first semiconductor pattern layer, wherein a portion of the first semiconductor pattern layer extends across the first gate and the first scan line; and
      a first source and a first drain, wherein the first source is electrically connected to the first data line;
   a second active device, comprising:
      a second gate;
      a second semiconductor pattern layer, wherein a portion of the second semiconductor pattern layer extends across the first scan line; and
      a second source and a second drain electrically connected to the second semiconductor pattern layer, and the second source is electrically connected to the second data line;
   a first shielding pattern layer extending across the first semiconductor pattern layer and the second semiconductor pattern layer, wherein the first shielding pattern layer extends across the second data line and does not extend across the first data line; and
   a second shielding pattern layer isolated from the first shielding pattern layer so that a gap, which extends across the first scan line, is formed between the first shielding pattern layer and the second shielding pattern layer, wherein the second shielding pattern layer extends across the first data line and does not extend across the second data line.

2. The active device array substrate of claim 1, further comprising:
   a third shielding pattern layer, wherein the third shielding pattern layer extends across the second semiconductor pattern layer and does not extend across the first data line and the second data line, respectively.

3. The active device array substrate of claim 1, further comprising:
   a first pixel electrode electrically connected to the first drain of the first active device; and
   a second pixel electrode electrically connected to the second drain of the second active device, wherein a polarity of the first data line is different from that of the second data line.

4. The active device array substrate of claim 3, wherein there is a first capacitance between the first shielding pattern layer and the first semiconductor pattern layer, and there is a second capacitance between the first shielding pattern layer and the second semiconductor pattern layer.

5. The active device array substrate of claim 1, wherein the first semiconductor pattern layer is a first U-shaped semiconductor pattern layer, two ends of the first U-shaped semiconductor pattern layer are located at one side of the first scan line, a center portion of the first U-shaped semiconductor pattern layer is located at another side of the first scan line, the second semiconductor pattern layer is a second U-shaped semiconductor pattern layer, two ends of the second U-shaped semiconductor pattern layer are located at one side of the first scan line, and a center portion of the second U-shaped semiconductor pattern layer is located at another side of the first scan line.

6. The active device array substrate of claim 5, wherein at least one of the first active device and the second active device comprises a dual-gate thin-film transistor.

7. The active device array substrate of claim 1, wherein the first semiconductor pattern layer is a U-shaped semiconductor pattern layer, two ends of the U-shaped semiconductor pattern layer are located at one side of the first scan line, a center portion of the U-shaped semiconductor pattern layer is located at another side of the first scan line, the second semiconductor pattern layer is an L-shaped semiconductor pattern layer, one end of the L-shaped semiconductor pattern layer is located at one side of the first scan line, and another end of the L-shaped semiconductor pattern layer is located at another side of the first scan line.

8. An active device array substrate, comprising:
   a first scan line;
   a first data line and a second data line;
   a first active device, comprising:
      a first gate electrically connected to the first scan line;
      a first semiconductor pattern layer, wherein a portion of the first semiconductor pattern layer extends across the first gate and the first scan line; and
      a first source and a first drain, wherein the first source is electrically connected to the first data line;
   a second active device, comprising:
      a second gate;
      a second semiconductor pattern layer, wherein a portion of the second semiconductor pattern layer extends across the first scan line; and
      a second source and a second drain electrically connected to the second semiconductor pattern layer, and the second source is electrically connected to the second data line; and
   a first shielding pattern layer extending across the first semiconductor pattern layer and the second semiconductor pattern layer, wherein the first shielding pattern layer extends across the second data line and does not extend across the first data line;
   further comprising:
   a second shielding pattern layer isolated from the first shielding pattern layer so that a gap is formed between the first shielding pattern layer and the second shielding pattern layer, wherein the second shielding pattern layer extends across the first data line and does not extend across both of the second data line and the second gate; and a third shielding pattern layer isolated from the first shielding pattern layer so that another gap is formed between the first shielding pattern layer and the third shielding pattern layer, wherein the third shielding pattern layer extends across the second semiconductor pattern layer and does not extend across the first data line and the second data line, respectively.

9. The active device array substrate of claim 8, wherein the first shielding pattern layer is disposed between the second shielding pattern layer and the third shielding pattern layer.

10. The active device array substrate of claim 8, further comprising:

a first pixel electrode electrically connected to the first drain of the first active device; and a second pixel electrode electrically connected to the second drain of the second active device, wherein a polarity of the first data line is different from that of the second data line, and wherein there is a first capacitance between the first shielding pattern layer and the first semiconductor pattern layer, and there is a second capacitance between the first shielding pattern layer and the second semiconductor pattern layer.

11. The active device array substrate of claim 8, wherein the first semiconductor pattern layer is a first U-shaped semiconductor pattern layer, two ends of the first U-shaped semiconductor pattern layer are located at one side of the first scan line, a center portion of the first U-shaped semiconductor pattern layer is located at another side of the first scan line, the second semiconductor pattern layer is a second U-shaped semiconductor pattern layer, two ends of the second U-shaped semiconductor pattern layer are located at one side of the first scan line, and a center portion of the second U-shaped semiconductor pattern layer is located at another side of the first scan line, wherein at least one of the first active device and the second active device comprises a dual-gate thin-film transistor.

* * * * *